(12) United States Patent  (10) Patent No.: US 8,710,730 B2
Ozawa et al.  (45) Date of Patent: Apr. 29, 2014

(54) LUMINESCENT NANOSHEETS, AND FLUORESCENT ILLUMINATORS, SOLAR CELLS AND COLOR DISPLAYS UTILIZING THE SAME AS WELL AS NANOSHEET PAINTS

(75) Inventors: Tadashi Ozawa, Tsukuba (JP); Takayoshi Sasaki, Ibaraki (JP)

(73) Assignee: National Institute for Materials Science, Tsukuba-shi (JP)

( * ) Notice: Subject to any disclaimer, the term of this patent is extended or adjusted under 35 U.S.C. 154(b) by 156 days.

(21) Appl. No.: 12/737,370

(22) PCT Filed: Jul. 13, 2009

(86) PCT No.: PCT/JP2009/062681
§ 371 (c)(1),
(2), (4) Date: Jan. 6, 2011

(87) PCT Pub. No.: WO2010/005101
PCT Pub. Date: Jan. 14, 2010

(65) Prior Publication Data
US 2011/0114175 A1  May 19, 2011

(30) Foreign Application Priority Data

Jul. 11, 2008 (JP) ................................. 2008-180826
Jul. 11, 2008 (JP) ................................. 2008-180828
Apr. 16, 2009 (JP) ................................. 2009-099595
Apr. 20, 2009 (JP) ................................. 2009-101578
Jun. 19, 2009 (JP) ................................. 2009-146595

(51) Int. Cl.
*H01L 51/54* (2006.01)

(52) U.S. Cl.
USPC ................................. 313/498; 252/301.4 R

(58) Field of Classification Search
USPC ................................. 313/498; 252/301.4 R
See application file for complete search history.

(56) References Cited

U.S. PATENT DOCUMENTS

| 7,903,156 B2 | 3/2011 | Nobori et al. | |
| 2008/0050573 A1* | 2/2008 | Nakano et al. | 428/220 |
| 2010/0226067 A1* | 9/2010 | Osada et al. | 361/311 |
| 2010/0317512 A1* | 12/2010 | Cordonier et al. | 502/340 |

FOREIGN PATENT DOCUMENTS

| JP | 2004-107527 | 4/2004 |
| JP | 2008-37961 A | 2/2008 |
| JP | 2008-207983 | 9/2008 |
| JP | 2008-231313 A | 10/2008 |
| JP | 2009-173785 A | 8/2009 |
| WO | WO 2008078652 A1 * | 7/2008 |

OTHER PUBLICATIONS

Tadashi Ozawa; "Kozonai ni Hakko Chushin o Fukumu Nanosheet Zairyo no Sosei to Tokusei Hyoka"; CSJ: The Chemical Society of Japan Koen Yokoshu, 2008, vol. 88, No. 1; p. 112.

(Continued)

*Primary Examiner* — Andrew Coughlin
(74) *Attorney, Agent, or Firm* — Manabu Kanesaka

(57) ABSTRACT

A luminescent nanosheet has perovskite octahedral crystals combined together in a planar configuration, and the octahedral crystals each have a multistacked crystal sheet structure wherein the octahedral crystals are multistacked over at least 3 folds in the direction vertical to a sheet plane, and an element providing a luminescence center is solid-solubilized between the multistacked octahedral crystals.

2 Claims, 13 Drawing Sheets

(56) References Cited

OTHER PUBLICATIONS

T. Ozawa; $Eu_{0.56}Ta_2O_7$; A New Nanosheet phosphor with the High Intrananosheet Site Photoactivator Concentration, Physical chemistry C Letters; 2008; vol. 112, p. 1312-1315.

T. Ozawa; Preparation and Characterization of the $Eu^{3+}$ Doped Perovskite Nanosheet Phosphor: $La_{0.90}Eu_{0.05}Nb_2O_7$, Chem. Mater.; 2007, vol. 19; p. 6575-6580.

S. Ida; Photoluminescence of Perovskite Nanosheets Prepared by Exfoliation of Layered Oxides, $K_2Ln_2Ti_3O_{10}$, $KLnNb_2O_7$, and $RbLnTa_2O_7$ (Ln: Lanthanide Ion, J. Am.Chem.Coc., 2008; vol. 130, p. 7052-7059.

E.C. Carroll, ultrafast Carrier Dynamics in Exfoliated and Functionalized Calcium Niobate Nanosheets in Water and methanol, J. Phys. Chem. C, 2008, vol. 112, p. 2394-2403.

Japan Patent Office, "Office action for JP 2009-099595," Jan. 14, 2014.

T. C. Ozawa et al, "(K1.5Eu0.5)Ta3O10: A Far-Red Luminescent Nanosheet Phosphor with the Double Perovskite Structure," American Chemical Society, 2008, p. 17115-17120.

* cited by examiner

FIG. 6(a)
FIG. 6(b)
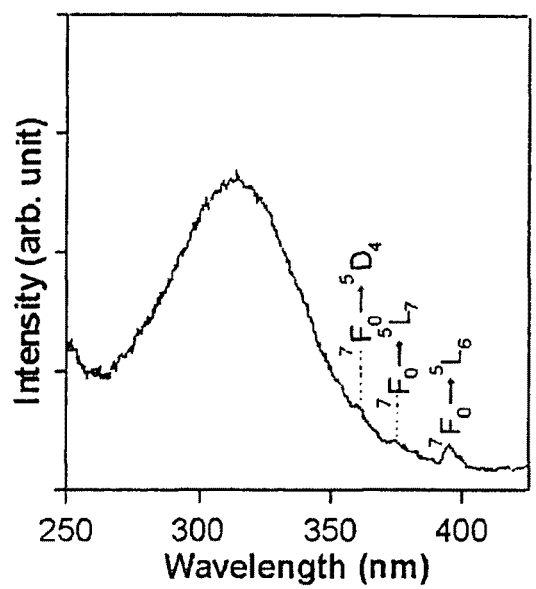
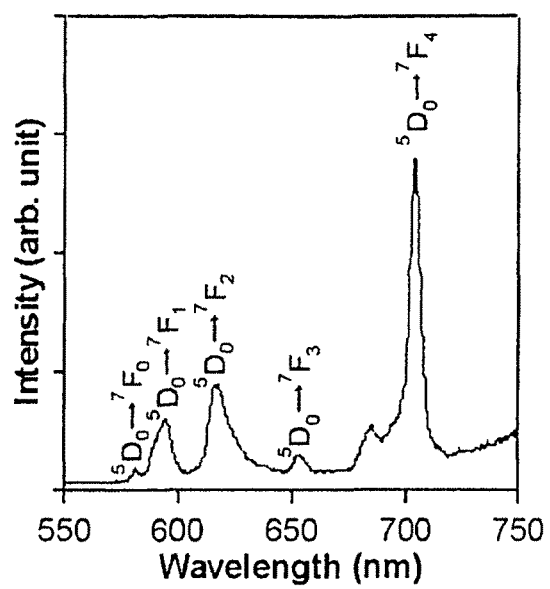

FIG. 8(A)    FIG. 8(B)    FIG. 8(C)    FIG. 8(D)
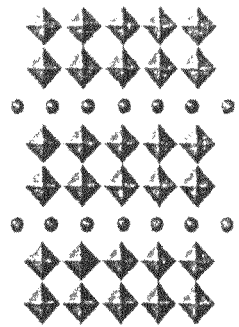
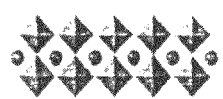
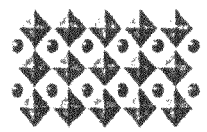
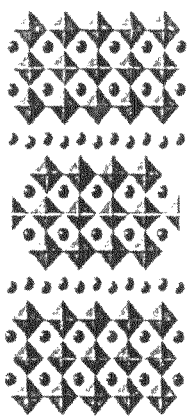
◆ Octahedral crystals
● Luminescence center elements (rare earth elements, alkaline metal elements, and alkaline earth metal elements)
● Alkaline metal elements or protons
FIG. 9(a)
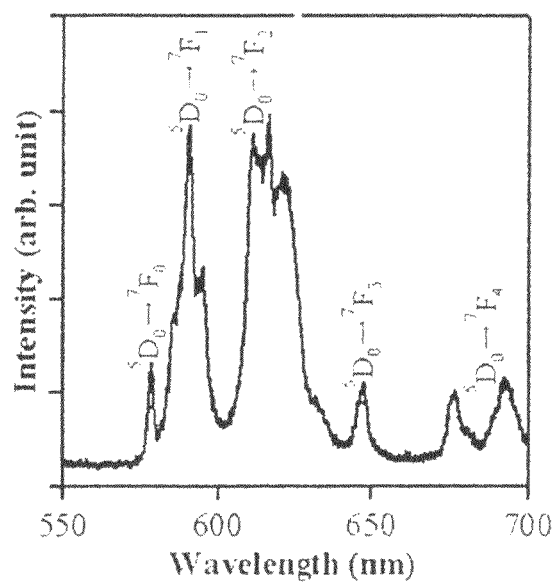
FIG. 9(b)
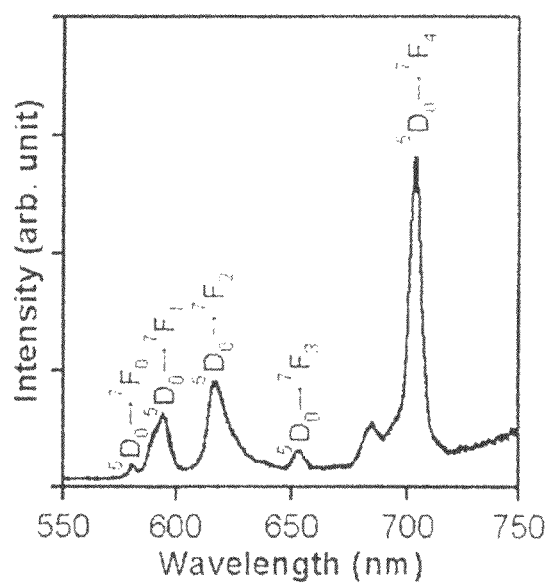

LUMINESCENT NANOSHEETS, AND FLUORESCENT ILLUMINATORS, SOLAR CELLS AND COLOR DISPLAYS UTILIZING THE SAME AS WELL AS NANOSHEET PAINTS

RELATED APPLICATIONS

The present application is National Phase of International Application No. PCT/JP2009/062681 filed Jul. 13, 2009, and claims priority from, Japanese Applications No. 2008-180826 filed Jul. 11, 2008; No. 2008-180828 filed Jul. 11, 2008; No. 2009-099595 filed Apr. 16, 2009; No. 2009-101578 filed Apr. 20, 2009; No. 2009-146595 filed Jun. 19, 2009, the disclosure of which is hereby incorporated by reference herein in its entirety.

BACKGROUND OF THE INVENTION

1. Field of the Invention

The present invention relates to a nanosheet paint suitable for dispersing a luminescent or the like in a disperse medium.

2. Description of the Prior Art

Development of this type of luminescent nanosheet is now in mounting demand because it allows an excitation source to be more likely to reach the luminescence center element than a conventional particle type luminescent substance.

As taught by Patent Publication 1, retaining the luminescence center element (ion) between nanosheets has been known (see FIG. 8(A)); however, this has failed in making much use of energy from the excitation source.

For this reason, solid-solubilization of luminescence center element in such a nanosheet as shown in FIG. 8(B) is still desired.

The nanosheet shown in FIG. 8(B) has the luminescence center taken and confined in a crystal structure; so it is more efficient than an arrangement with a luminescence center or the like sandwiched between nanosheets in terms of transition of excitation energy from the host or nanosheet to the luminescence center. It could also have been confirmed that luminescence features stabilized with respect to temperature and humidity are achievable because of no need of intermediaries such as water for transition of excitation energy from the host or nanosheet to the luminescence center.

As shown in FIG. 2 of Non-Patent Publication 1, it has been well known that perovskite substances each take various rare earth ions in a perovskite structure as the luminescence center, turning into a luminescent substance. However, Non-Patent Publication 1 does not show solid-solubilization of a rare earth luminescence center between octahedral crystals of a multistacked crystal sheet structure wherein perovskite octahedral crystals are stacked over at least 3 high in the vertical direction to a sheet plane.

As set forth in Non-Patent Publications 2 and 3, it has been well known that alkaline metal ions in layered perovskite containing niobium or tantalum may easily ion exchange with other alkaline metal ions ($Li^+$, $Na^+$, $Rb^+$, $Cs^+$) or monovalent ions ($NH_3^+$, $Ag^+$, $H^+$, $n-C_8H_{17}NH_3$, $C_5H_5NH^+$, $Tl^+$); however, neither of them shows solid-solubilization of the rare earth luminescence center between the perovskite octahedral crystals of such a multistacked crystal sheet structure as described above.

Non-Patent Publications 4 and 5 have revealed that the rare earth luminescence center may be doped at not only a rare-earth site but also an alkaline metal site in the layered perovskite containing niobium or tantalum; however, neither of them show solid-solubilization of the rare earth luminescence center between the perovskite octahedral crystals of such a multistacked crystal sheet structure as described above.

Referring to perovskite-type layers $A_2Ta_3O_{10}$ containing tantalum, Non-Patent Publications 6 and 7 have reported that although the elemental composition ratio of A to tantalum is basically 2, the amount of the element at the A site may be decreased (down to 16 mol %) or increased (up to 22.5 mol %) by electrochemical reactions, acid treatments or the like while the perovskite structure is kept intact; however, neither of them again show solid-solubilization of the rare earth luminescence center between the perovskite octahedral crystals of such a multistacked crystal sheet structure as described above.

Non-Patent Publication 8 has unveiled synthesis of a triple perovskite nanosheet having a quadruple crystal sheet structure wherein perovskite octahedral crystals are stacked over 4 high in the vertical direction to the sheet plane; however, it does not show solid-solubilization of the luminescence center between the octahedral crystals.

So far, nanosheets have been obtained by exfoliating a substance having the aforesaid layered structure and dispersing it in a disperse medium, as shown typically in Non-Patent Publications 9 and 10.

In other words, satisfactory dispersion of that substance in the disperse medium has been considered as an essential requirement for obtaining a thinner nano-sheet; nanosheets have been created by dispersion using the disperse medium in an amount much larger than the amount of the nanosheet to be dispersed. In addition, such a nanosheet solution has seemed to aggregate; it has been important for utilization of that nanosheet to prevent the once thinned film from gaining thickness by reaggregation.

Therefore, when the obtained nanosheet solution that is of extremely low concentration is used as such, for instance when it is coated on a glass substrate or the like, it would be repelled, resulting in unsatisfactory coating.

LISTING OF THE PRIOR ARTS

Listing of the Patent Publications

Patent Publication 1: JP(A) 2004-285812

Listing of the Non-Patent Publications

Non-Patent Publication 1: Chemistry of Materials, Vol. 9, pp. 664, 1997, Kudo
Non-Patent Publication 2: Materials Research Bulletin, Vol. 22, pp. 413, 1987, Gopalakrishnan et al.
Non-Patent Publication 3: Solid State Ionics, Vol. 93, pp. 177, 1997, Toda et al.
Non-Patent Publication 4: Materials Research Bulletin, Vol. 16, pp. 1429, 1981, Dion et al.
Non-Patent Publication 5: Journal of Alloys and Compounds, Vol. 311, pp. 159, 2000, Bizeto et al.
Non-Patent Publication 6: Physica C, Vol. 455-448, pp. 26, 2006, Kato et al.
Non-Patent Publication 7: Journal of Physical Chemistry C, Vol. 112, pp. 1312, 2008, Ozawa et al.
Non-Patent Publication 8: Chemistry of Materials, Vol. 2, pp. 279, 1990, Treacy et al.
Non-Patent Publication 9: Chemistry of Materials, Vol. 19, pp. 6575, Ozawa et al.
Non-Patent Publication 10: Journal of Physical Chemistry C, Vol. 112, pp. 1313, Ozawa et al.

SUMMARY OF THE INVENTION

Objects of the Invention

An object of the invention, which such prior arts as described above underlie, is to provide a novel luminescent nanosheet wherein a luminescence center element is solid-solubilized in a nanosheet having perovskite octahedral crystals combined together in a planar configuration, and its applications. Another object of the invention is to break down such conventional common knowledge of nanosheet solutions, thereby providing a nanosheet paint using a high-concentration nanosheet solution suitable for dispersion of luminescent nanosheets or the like.

Means for Accomplishing the Objects

The first aspect of the invention provides a luminescent nanosheet having perovskite octahedral crystals combined together in a planar configuration, characterized in that said octahedral crystals each have a multistacked crystal sheet structure (shown in FIG. 8(c)) wherein the octahedral crystals are multistacked over at least 3 high in the direction vertical to a sheet plane, and an element providing a luminescence center is solid-solubilized between the multistacked octahedral crystals.

According to the $2^{nd}$ aspect of the invention, the luminescent nanosheet of the $1^{st}$ aspect is further characterized in that said perovskite octahedral crystals are each comprised of a tantalum oxide or a niobium oxide, and said luminescence center element is a rare earth element (ion).

The $3^{rd}$ aspect of the invention provides a fluorescent illuminator comprising a fluorescent substance that receives excitation energy from an excitation source to emit out visible light having a given wavelength, characterized in that said fluorescent substance is a nanosheet as recited in claim 1 or 2.

The $4^{th}$ aspect of the invention provides a solar cell that uses a photoelectric device capable of generating electricity upon receipt of light and has on a light-receiving surface side of said photoelectric device a photofilter that is excited by solar light to emit out light having a wavelength different from that of solar light, characterized in that said photofilter comprises a luminescent nanosheet as recited in claim 1 or 2.

The $5^{th}$ aspect of the invention provides a color display comprising a luminescent substance that receives distinct excitation energies from distinct excitation sources to emit out light in distinct colors, characterized in that said luminescent substance comprises a luminescent nanosheet as recited in claim 1 or 2, or a combination of it with other luminescent nanosheet or other luminescent substance.

The $6^{th}$ aspect of the invention provides a nanosheet paint, characterized in that an X value in the following equation 1 found from a vapor pressure of a disperse medium and a concentration of the nanosheet is in a range of less than $4.9 \times 10^6$ to greater than $3.8 \times 10^3$:

$$X = C \times V^{4.01} \qquad 1$$

where C is the concentration (M) of the nanosheet, and V is the saturation vapor pressure (torr) of the solvent at 25° C. and 1 atm.

Advantages of the Invention

The nanosheets of the $1^{st}$ and $2^{nd}$ aspects of the invention are found to emit out light in quite distinct colors due to crystal structure differences even with use of conventional luminescence center elements (ions).

This could probably be ascribed to the facts that the efficiency of transformation from the excitation source is much more improved than could be achieved with a single type (shown in FIG. 8(B)) perovskite nanosheet, and that even factors that may change but have nothing to do with emission colors are much more improved, giving influences to emission colors.

In any event, there is an unheard-of phenomenon hard to understand by reason of mere function improvements: the inventive substance should be recognized as a novel luminescent substance.

There is a novel finding underlying the inventive nanosheet paint that the nanosheet once dispersed in the disperse medium does not easily aggregate; even when the concentration of the nanosheets is increased by removal of a part of the disperse medium, it is quite unlikely that they aggregate together, ridding the nanosheets of their own nature. It is thus possible to provide a solution containing the nanosheet in higher concentrations.

In addition, those high concentrations mean that viscosity can also be kept high, eliminating repelling problems upon coating onto substrates.

BRIEF DESCRIPTION OF THE DRAWINGS

FIG. 6 shows (a) an excitation spectrum (as measured by fluorescence at 704 nm) and (b) a fluorescence spectrum (as excited at 314 nm) of a $(K_{1.5}Eu_{0.5})Ta_3O_{10}$ nanosheet, respectively.

FIG. 8 is illustrative in schematic of relations of differences in crystal structure and luminescence center element positions: FIG. 8(A) shows a luminescence center element interposed between nanosheets, FIG. 8(B) shows a luminescence center element solid-solubilized in a single perovskite nanosheet as an example, FIG. 8(C) shows a luminescence center element solid-solubilized in a double perovskite nanosheet as an example, and FIG. 8(D) shows a luminescence center element solid-solubilized in a double perovskite layered substance as an example.

FIG. 9 is a graph indicative of differences in luminescence characteristics.

FIG. 13 is a photograph illustrative of what state the sample of Experiment No. 2 is coated on a quartz substrate in.

FIG. 14 is a photograph illustrative of what state the sample of Experiment No. 3 is coated on a quartz substrate in.

FIG. 15 is a photograph illustrative of what state the sample of Experiment No. 4 is coated on a quartz substrate in.

FIG. 17 is a photograph illustrative of what state a nanosheet solution in a $3 \times 10^{-4}$ M ethanol solution in Example 4 is coated on a glass substrate in.

FIG. 18 is a photograph illustrative of what state a nanosheet solution in a $6 \times 10^{-2}$ M ethanol solution in Example 4 is coated on a glass substrate in.

EMBODIMENTS FOR CARRYING OUT THE INVENTION

Figure 1:
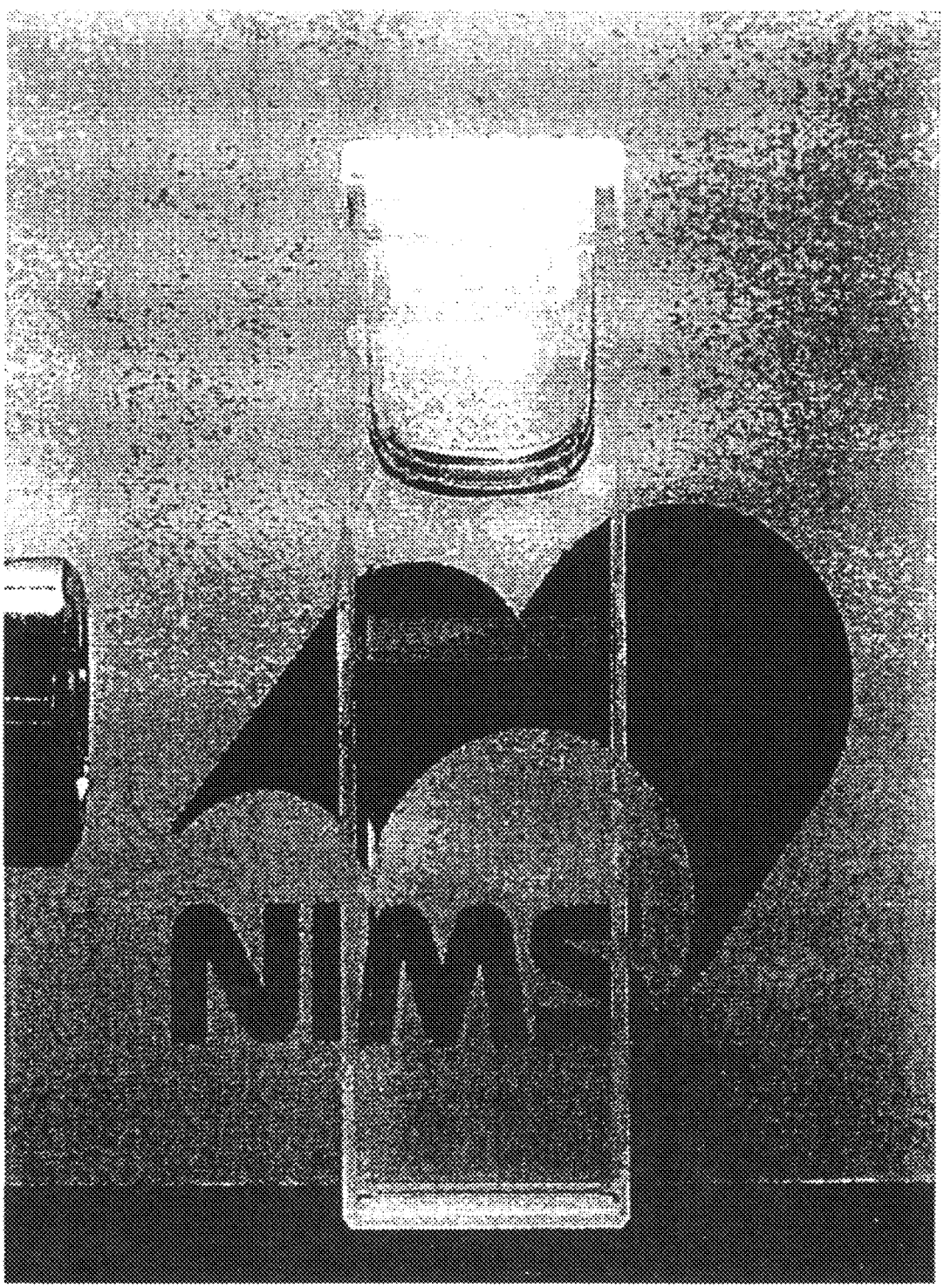
FIG. 1 is a photograph taken of the Tyndall effect of a $(K_{1.5}Eu_{0.5})Ta_3O_{10}$ nanosheet that is diffusing laser beams.

The present invention provides a luminescent nanosheet having perovskite octahedral crystals combined together in a planar configuration, characterized in that said octahedral crystals each have a multistacked crystal sheet structure wherein the octahedral crystals are multistacked over at least 3 high in the direction vertical to a sheet plane, and an element providing a luminescence center is solid-solubilized between the multistacked octahedral crystals. In Example 1 given later, Eu is used as the element that provides a luminescence center; however, solid solubilizing rare earth ions other than Eu in the crystal structure as the luminescence center thereby enabling various emission colors to be obtained may be implemented by such well-known technology as set forth in Non-Patent Publication 1.

As known in the art, some perovskite crystals using niobic acid instead of tantalum oxides in Example 1 provide similar luminescent substances too. According to this known technology, the starting material in Example 1 may be changed from tantalic acid to niobic acid thereby obtaining niobium oxide nanosheets of the double perovskite type (triple crystal sheet structure). In other words, it is possible to emit out light in a wide spread of colors by changing the types of rare earth ions.

In Example 1 given later, $K^+$ is used as the alkaline metal ions in the layered perovskite. As set forth in Non-Patent Publications 2 and 3, however, $K^+$ is susceptible of ion exchange with other alkaline metal ions ($Li^+$, $Na^+$, $Rb^+$, $Cs^+$) or monovalent ions ($NH_3^+$, $Ag^+$, $H^+$, $n-C_8H_{17}NH_3$, $C_5H_5NH^+$, $Tl^+$) so that there can be luminescent nanosheets obtained that use as precursors a wide spread of double perovskite niobium or tantalum oxide layered compounds making use of the aforesaid monovalent cations.

Non-Patent Publication 4 has unveiled that not only the rare earth site but also the alkaline metal site in layered perovskite containing niobium or tantalum may be doped with rare earth luminescence centers. Given this known technology, it is possible to easily obtain not only the $(K_{1.5}Eu_{0.5})Ta_3O_{10}$ luminescent nanosheet of Example 1 given later but also double perovskite niobium or tantalum oxide luminescent nanosheets comprising $A_2Ta_3O_{10}$ where A is selected from alkaline metals (Li, Na, K, Rb, Cs), alkaline earth metals (Mg, Ca, Sr, Ba) and rare earths (Y, La, Ce, Pr, Nd, Sm, Eu, Gd, Tb, Dy, Ho, Er, Tm, Yb, Lu) and used in varying ratios.

Although the elemental composition ratio of A to tantalum in those substances is basically 2, it is understood that, as set forth in Non-Patent Publications 6 and 7, the amount of the element at the site A may be decreased (down to 16 mol %) or increased (up to 22.5 mol %) by electrochemical reactions, acid treatments or the like while the perovskite structure is kept intact.

The double perovskite luminescent nanosheet $(K_{1.5}Eu_{0.5})Ta_3O_{10}$ is exemplified in Example 1. It is here to be noted that Non-Patent Publication 8 has revealed the synthesis of a triple perovskite nanosheet having a quadruple crystal sheet structure wherein one more stack of octahedral crystals is added to the double perovskite in the direction vertical to the sheet plane to obtain a four-stacked arrangement.

From Example 1 given later, it has been found that the luminescence center element can be incorporated in just only the single perovskite known so far in the art but the double perovskite as well. Given the underlying principles, there would be no difficulty in application to at least quadruple perovskite; that is, it would be possible to easily solid-solubilize the element serving as the luminescence center between the octahedral crystals in the triple perovskite nanosheet known in the art or even between the octahedral crystals in the perovskite nanosheet wherein one more stack of octahedral crystals is provided.

The emission wavelength of a luminescent material with the Eu luminescence center taken in it depends on both the host structure and the atoms of which it is composed; so even when the Eu luminescence center is taken in a double perovskite tantalum, oxide nanosheet host where there are deficiencies at each of other atom sites or replacements by other elements, there are far red light emissions (near 704 nm) obtainable.

If the oxide of tantalum or niobium having a large atomic mass is used as the host, it will then be readily expectable that consumption by lattice vibration of excitation energy from the effect of that heavy element is much reduced. This will in turn result in efficient transformation from excitation energy to luminescent energy.

Referring here to a silicon-based solar cell, the maximum value of its light absorption is in the vicinity of 700 to 900 nm. Accordingly, $A_2Ta_3O_{10}$ luminescent nanosheets (A is an alkaline metal, an alkaline earth metal or Eu) capable of transforming ultraviolet into far red color (704 nm) may be used on filters for making photoelectric transformation efficient.

In short, the inventive luminescent nanosheet and its applications are understood to embrace Example 1 given just below as well as a wide spread of modifications to which the ensuing findings are readily applicable.

EXAMPLE 1

Synthesis

A double perovskite tantalum oxide luminescent nanosheet with Eu included as the luminescence center in the crystal structure is synthesized by three processes. First of all, a double perovskite tantalum oxide K $(K_{1.5}Eu_{0.5})Ta_3O_{10}$ that becomes the first precursor is obtained by mixing together powders of the raw materials $K_2CO_3$, $Eu_2O_3$ and $Ta_2O_5$ at 5:1:3, and applying a solid-phase reaction to the mixture in a platinum crucible at 1,225° C.

By allowing the first precursor $K(K_{1.5}Eu_{0.5})Ta_3O_{10}$ to react with about 2M nitric acid at room temperature for 3 days, it is changed into the second precursor that is an acidic solid in which the alkaline metal in the first precursor is ion exchanged with H. Finally, the second precursor and an aqueous solution of a bulky, alkaline molecule: tetrabutylammonium hydroxide (TBAOH) are reacted under agitation at room temperature for 1 week to exfoliate the layered oxide precursor layer by layer.

Thus, $(K_{1.5}Eu_{0.5})Ta_3O_{10}$ that is the double perovskite tantalum oxide luminescent nanosheet with the Eu luminescence center included in the crystal structure is obtained.

Although the synthesis of the $(K_{1.5}Eu_{0.5})Ta_3O_{10}$ nanosheet is here exemplified, it is to be understood that other $A_2Ta_3O_{10}$ nanosheets (A is an alkaline metal (Li, Na, K, Rb, Cs), an alkaline earth metal or a rare earth with or without deficiencies at A, Ta and O) may also be obtained by similar processes.

TABLE 1

Experiment No. 1

| $1^{st}$ Precursor | |
|---|---|
| Composition | $K(K_{1.5}Eu_{0.5})Ta_3O_{10}$ |
| Raw Material | $K_2CO_3$:$Eu_2O_3$:$Ta_2O_5$ |
| Mixing Ratio by Mass | 5:1:3 |
| Solid-Phase Reaction Temp. | 1,225° C. |
| $2^{nd}$ Precursor | |
| Reaction Solution | Nitric Acid Solution (2M) |
| Reaction Time | 7 Days |
| Composition* | $H(K_{1.5}Eu_{0.5})Ta_3O_{10}$ |
| Exfoliation | |
| Solution | TBAOH Aqueous Solution (0.085M) |
| Reaction Time | 3 Days |
| Nanosheet | |
| Composition | $(K_{1.5}Eu_{0.5})Ta_3O_{10}$ |
| Layer Structure | Three Layers |

Composition*: Presumed from the nanosheet composition obtained by exfoliation.

Estimation

The elemental composition in the condensate of the $(K_{1.5}Eu_{0.5})Ta_3O_{10}$ nanosheet synthesized under the above conditions and indicated by Experiment No. 1 was estimated by EPMA. It has consequently been confirmed that the elemental composition ratio is 1.5:0.5:3 for K:Eu:Ta, indicating that this nanosheet have the composition: $(K_{1.5}Eu_{0.5})Ta_3O_{10}$.

Figure 2:
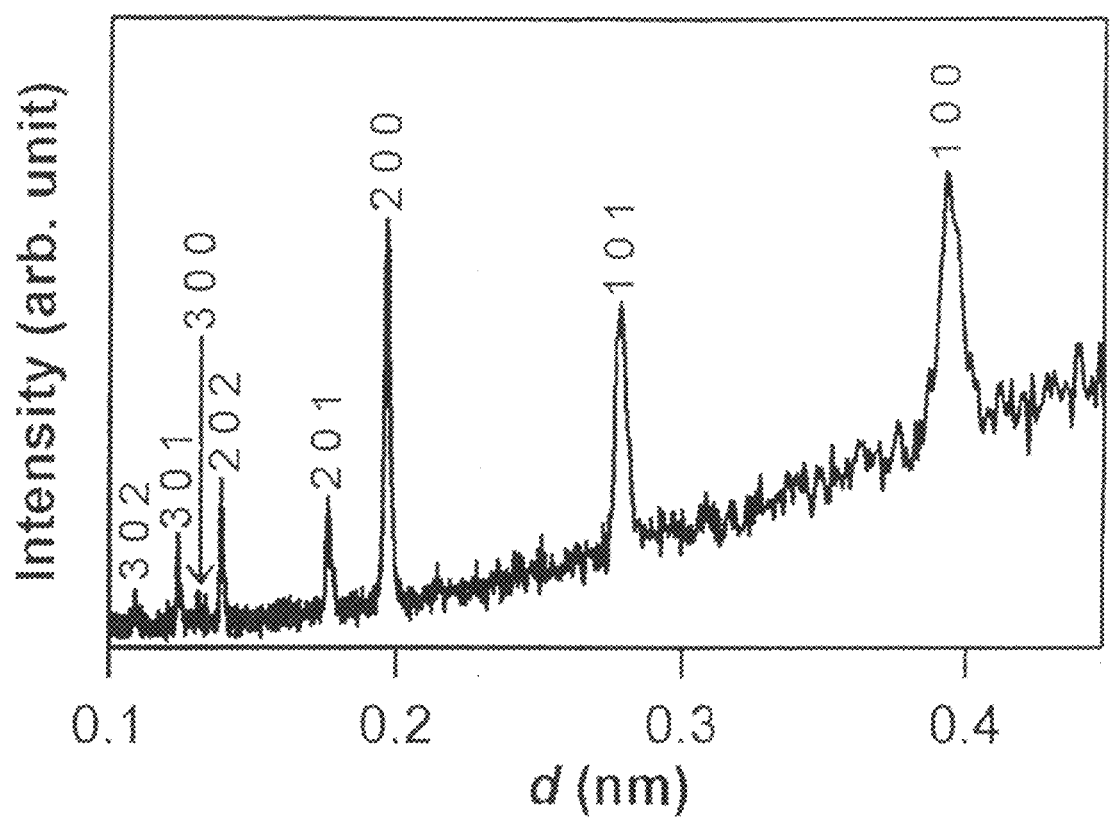
FIG. 2 shows an in-plane diffraction pattern of a $(K_{1.5}Eu_{0.5})Ta_3O_{10}$ nanosheet, as found using radiation X-rays.
Figure 3A:
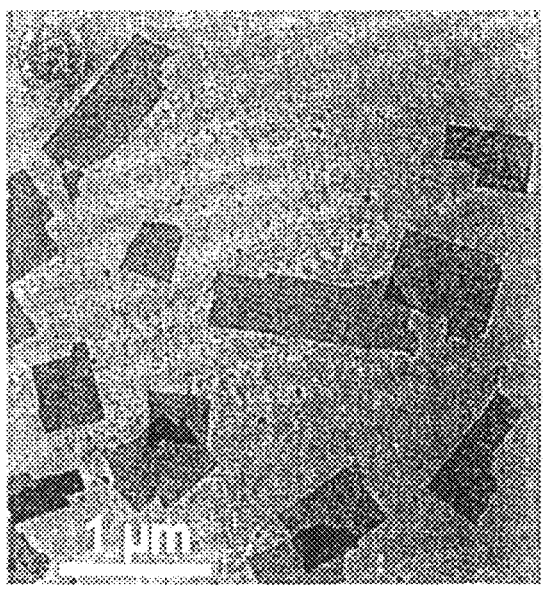
FIG. 3 shows (a) a TEM image and (b) a selected area electron-beam diffraction pattern of a $(K_{1.5}Eu_{0.5})Ta_3O_{10}$ nanosheet, respectively.
Figure 3B:
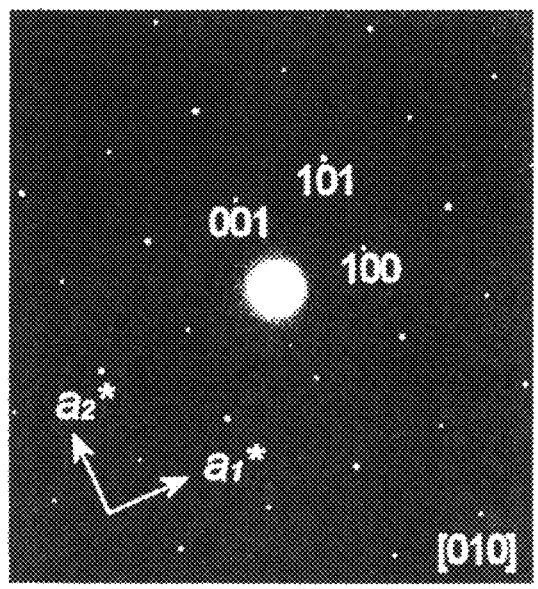
Figure 4A:
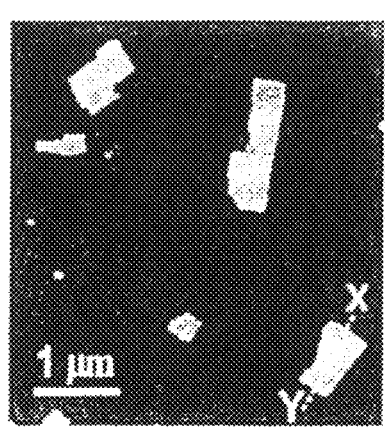
FIG. 4 shows the shape of a $(K_{1.5}Eu_{0.5})Ta_3O_{10}$ nanosheet, as observed under an atomic force microscope.
Figure 4B:
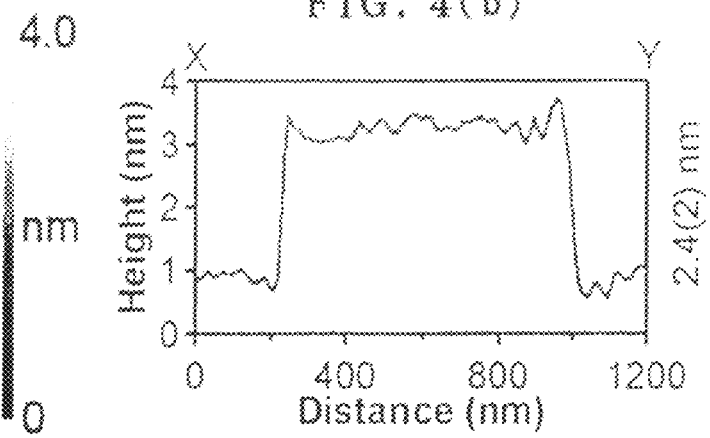
Figure 5:
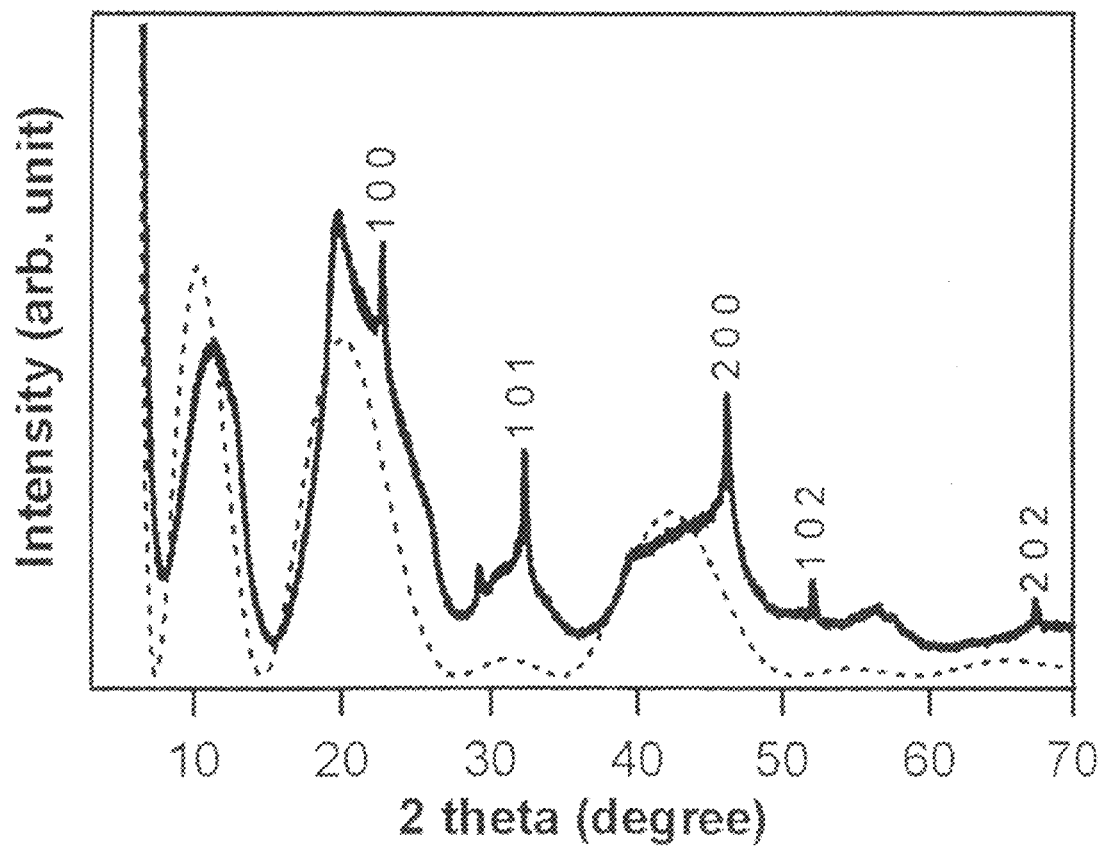
FIG. 5 shows an X-ray diffraction pattern of a condensed $(K_{1.5}Eu_{0.5})Ta_3O_{10}$ nanosheet, with a dotted line indicative of a diffraction pattern figured out on the basis of a tantalum double perovskite structure model.

It has also been confirmed from the Tyndall effect that the synthesized nanosheet is colloidally diffused in the solution (FIG. 1). From the results of in-plane X-ray diffraction using synchrotron radiation X-rays, it has further been confirmed that this nanosheet keeps intact the perovskite-based structure of the bulk precursor (FIG. 2). And from shape observation under a transmission electron microscope, the ensuing nanosheet has been found to have uniform thickness, and from the results of selected area electron diffraction, it has been found to keep intact the perovskite-based structure of the precursor (FIG. 3). From shape observation under an atomic force microscope, this nanosheet has been found to have a uniform thickness of 2.4 (2) nm (FIG. 4). The X-ray diffraction of the condensate by a centrifuge of the nanosheet suspension has matched well with that calculated on the basis of a $(K_{1.5}Eu_{0.5})Ta_3O_{10}$ tantalum double perovskite structure model, indicating that this nanosheet has a tantalum double perovskite structure (FIG. 5).

Figure 7:
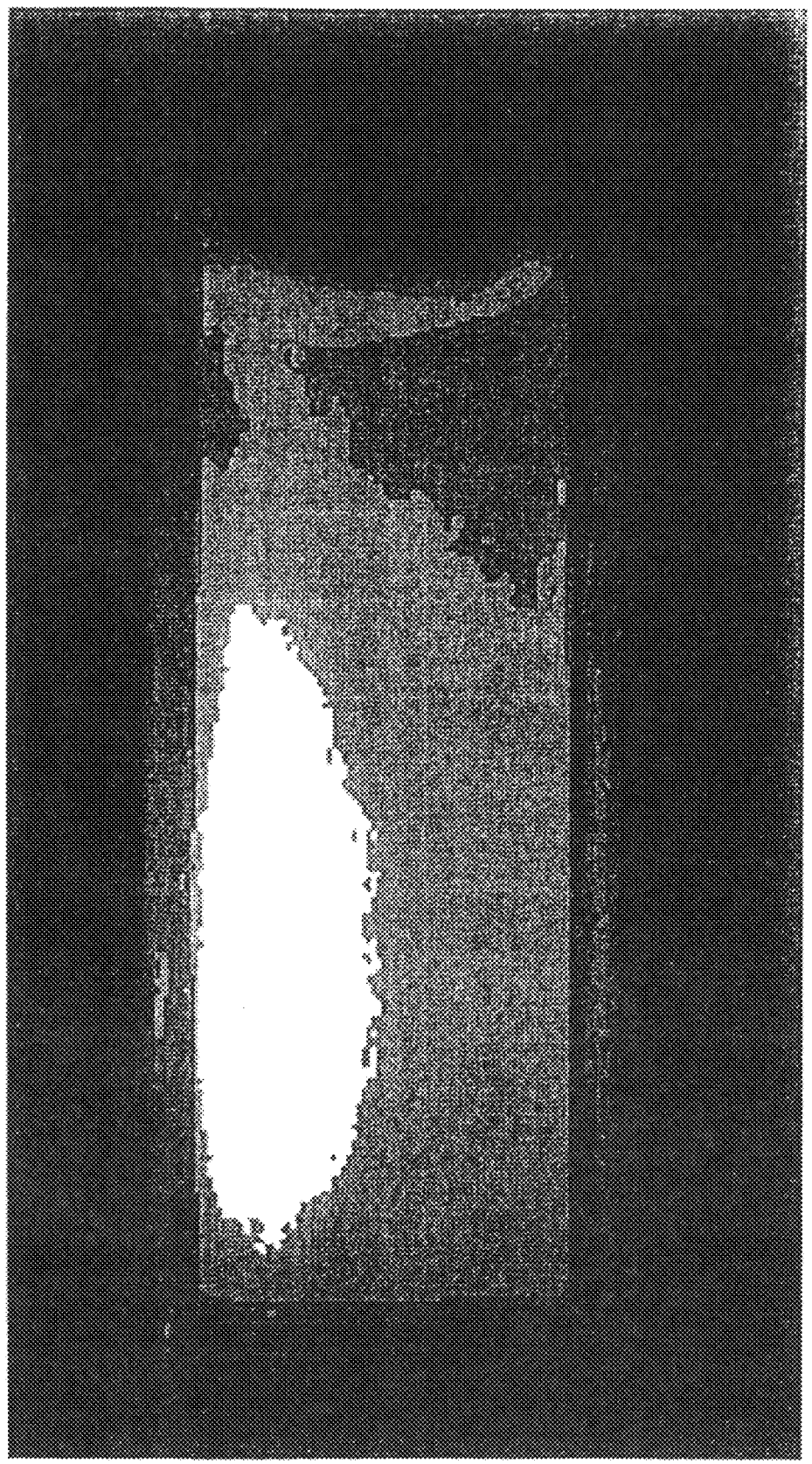
FIG. 7 is a photograph taken of a $(K_{1.5}Eu_{0.5})Ta_3O_{10}$ nanosheet suspension that is emitting out light by ultraviolet irradiation.

FIG. 6 shows the fluorescence characteristics of the $(K_{1.5}Eu_{0.5})Ta_3O_{10}$ nanosheet having the strongest emission intensity near 704 nm (far red). In many other luminescent substances including the Eu luminescence center, red emissions near 612 nm due to transition from $^5D_0$ to $^7F_2$ have the strongest intensity, whereas in the $(K_{1.5}Eu_{0.5})Ta_3O_{10}$ nanosheet, far red emissions due to transition on a high wavelength side from $^5D_0$ to $^7F_4$ of $Eu^{3+}$ have the strongest intensity. From the fact that the emission wavelength at which the strongest emission intensity is obtained depends on the structure of the host with the luminescence center taken in it and the type of atoms of which it is composed, far red emissions out of the $(K_{1.5}Eu_{0.5})Ta_3O_{10}$ nanosheet would be obtained through the incorporation of the Eu luminescence center in the tantalum double perovskite nanosheet host. From the excitation spectra of the $(K_{1.5}Eu_{0.5})Ta_3O_{10}$ nanosheet, it has been confirmed that emissions by excitation of the nanosheet host near 314 nm are much higher in efficiency than by direct excitation of the $Eu^{3+}$ luminescence center. In addition, this nanosheet is found to emit out light having a luminous intensity high enough to be visible by the naked eye (FIG. 7).

Differences Between the Single and the Double

Existing niobium or tantalum perovskite oxide nanosheets each have the (single perovskite) structure wherein octahedrons, each made up of niobium or tantalum and oxygen, are stacked over 2 high in the direction vertical to the sheet (see FIG. 8(B)).

What is here provided has the (double perovskite) structure wherein octahedrons are stacked over three high in the direction vertical to the sheet (see FIG. 8(C)). Now that the properties of a substance depend heavily on its structure, the inventive double perovskite oxide nanosheet (double perovskite oxide nanosheet doped with the $Eu^{3+}$ luminescence center: $(K_{1.5}Eu_{0.5})Ta_3O_{10}$) could possibly have physical properties different from those of existing single perovskite nanosheets (single perovskite oxide nanosheets doped with the $Eu^{3+}$ luminescence center: $Eu_{0.56}Ta_2O_7$).

Actually with the same excitation source (314 nm wavelength light) used, the single perovskite nanosheet doped with the $Eu^{3+}$ luminescence center gives out red emissions near 615 nm (FIG. 9(a)), whereas the exemplified double single perovskite nanosheet doped with the $Eu^{3+}$ luminescence center gives out far red emissions near 704 nm (FIG. 9(b)).

Referring then to the inventive nanosheet paint, a part of the disperse medium is removed to make its concentration so high that it may also be applied to increase the concentration of a nanosheet solution obtained by exfoliation and dispersion of a substance having a layered structure.

Removal by centrifugal separation, evaporation of the disperse medium, etc. may be applied to this end.

It has here been revealed that coatability is governed by the X value in the following equation 1 determined primarily by the concentration of the nanosheet and the vapor pressure of the disperse medium.

$$X = C \times V^{4.01} \quad\quad 1$$

where C is the concentration (M) of the nanosheet, and V is the saturation vapor pressure (torr) of the solvent at 25° C. and 1 atm.

From Examples 2 to 4 given later, the upper limit to the X value in Equation 1 should be set at less than $4.9 \times 10^6$, preferably $4.5 \times 10^6$ or less, more preferably $4 \times 10^6$ or less, and even more preferably less than $3.3 \times 10^6$ (M torr$^{4.01}$).

The lower limit, on the other hand, should be set at greater than $3.8 \times 10^3$, preferably $4 \times 10^3$ or greater, more preferably $4.5 \times 10^3$ or greater, and even more preferably $5 \times 10^3$ or greater (M torr$^{4.01}$).

It is here to be noted that the lower limit is less likely to be affected by the vapor pressure of the disperse medium than the upper limit; it may be determined by concentration alone, and in that case, the concentration of the nanosheet should be set at $1\times10^{-2}$ M or greater.

Being short of that lower limit will give rise to a demerit of the paint being repelled upon coating onto a substrate.

Concentrations higher than the upper limit to the X value will render uniform thickness coating difficult.

As already well known in the art, a concentration/diffusion cycle in which after concentration, the nanosheet is diffused in other solvents (alcohol, acetone, hexane, etc.) is repeated thereby turning the nanosheet into nanosheet solutions (paints) in a variety of solvents; that is, it will be readily appreciated from Examples 2 to 4 given later that there can be a variety of dispersion media used.

The aforesaid Equation 1 works effectively, especially for a volatile disperse medium whose vapor pressure is higher than that of water; for instance when there is a disperse medium of high volatility such as ethanol used, the solvent condenses at low densities because of rapid evaporation speed of the solvent during regulation of its concentration by evaporation, resulting in the inability to reduce the volume in the concentration=number of moles/volume down to a sufficient level. In that case, the paint may be regulated beforehand in terms of coatability, with this in consideration.

The present invention may also be applied to paints used with spin coating, screen printing, ink jet printing or other methods. With water used as the disperse medium, the concentration of about 0.27 M (a density of 1.3 g/cm$^3$) is best.

Most preferable for Equation 1, $X=8.9\times10^4$ M torr$^{4.01}$, and the most preferable range would be within±single-figure number from it.

In the examples given later, the $K_{1.5}Eu_{0.5}Ta_3O_{10}$ nanosheet solution will be exemplified; however, it will be readily appreciated that conventional known nanosheets made up of other compositions, too, may bring about such inventive advantages as described above.

The present invention may be applied not only to nanosheets having a function of emitting light but also to photocatalysts (for decomposition of organic matters, ultra-hydrophilic nature, decomposition of water into hydrogen and oxygen, etc.), high dielectric devices, room-temperature ferromagnetic devices, macro-magnetic optical polarization devices capable of responding to ultraviolet light, and multi-layered structure devices having orientation crystals formed on nanosheets as seed crystals, etc.

Especially in the aforesaid multilayered structure, the nanosheet is generally very large in terms of the ratio between its longitudinal direction size (of micro-order) and its thickness (of nano-order) so that a film with oriented crystals could likely be formed by simple coating of the nanosheet paint, resulting readily in creation of a single- or multi-layered structure having uniform orientation.

EXAMPLE 2

Example 2 is now explained with reference to a $K_{1.5}Eu_{0.5}Ta_3O_{10}$ nanosheet solution as an example.

Synthesis

The nanosheet solution is obtained by soft chemical exfoliation of the respective layers of a layered oxide into individually independent layers, as set forth in Publications 9 and 10. In this state, the nanosheet was found to have a concentration of $5.2\times10^{-4}$ M.

This luminescent nanosheet aqueous solution was condensed by a centrifuge at the rpm and centrifuging time set out in Table 2, given just below. Then, the supernatant liquid was removed off to obtain a high-concentration nanosheet solution with the concentration and density set out in Table 2.

TABLE 2

| Experiment No. | RPM, ×10$^3$ rpm (G) | Centrifuging Time, hours | Concentration, M | Density, g/cm$^3$ | Results of Coating |
|---|---|---|---|---|---|
| 1 | 20 (36,000) | ½ | 0.27 | 1.3 | Coating on the quartz glass substrate |

Estimation

The nanosheet solution (Experiment No. 1) synthesized under the above conditions could be brush-coated on a quartz substrate without being repelled.

Figure 10A:
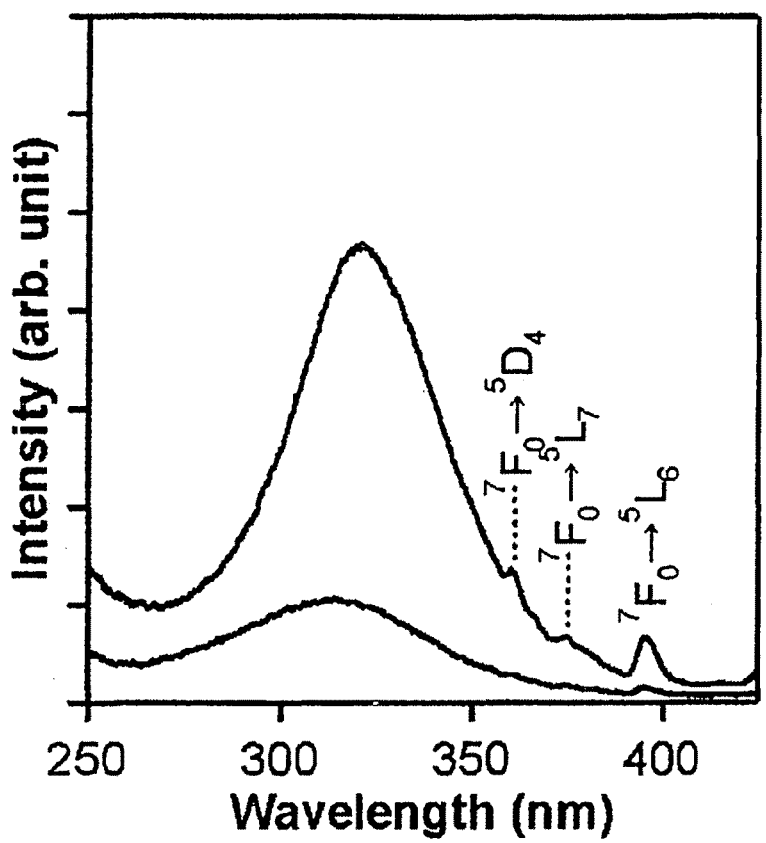
FIG. 10 shows (a) excitation spectra (as measured at 704 nm) and (b) fluorescence spectra (as excited by 322 nm ultraviolet radiation) in gray lines of a sample prepared by brush-coating a quartz glass substrate with a nanosheet solution having an increased concentration in Experiment No. 1. Note here that black lines are indicative of the excitation and fluorescence characteristics of a luminescence nanosheet aqueous solution prior to being condensed by means of a centrifuge.
Figure 10B:
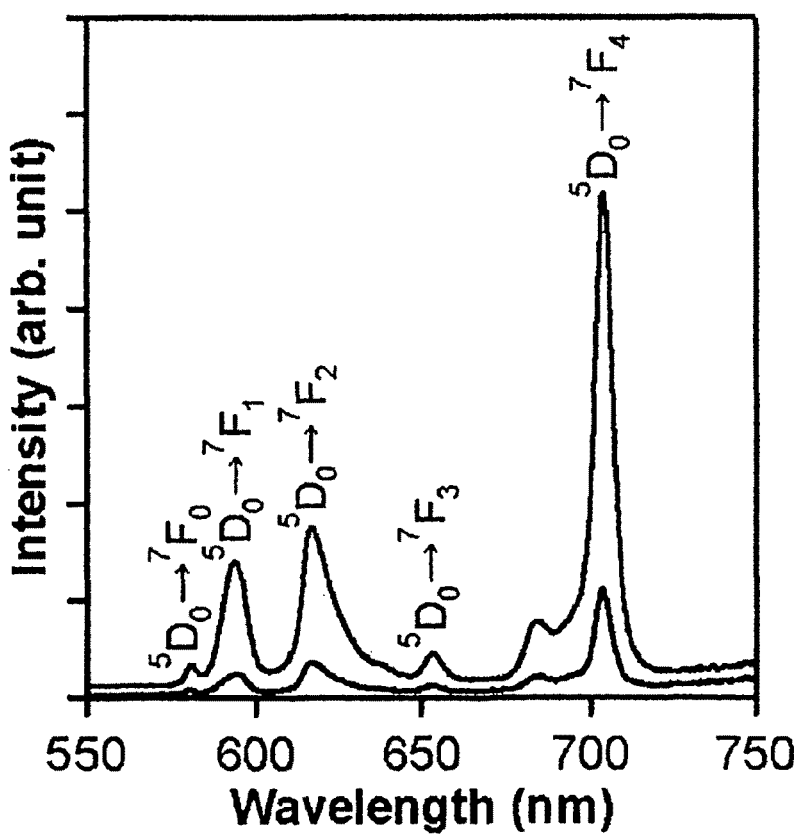
Figure 11A:
FIG. 11 is photographs of a sample prepared by writing a Chinese character meaning "light" on a quartz glass substrate using the luminescent nanosheet of Experiment No. 1 and a brush, as taken under (a) white light and (b) ultraviolet radiation, respectively.
Figure 11B:
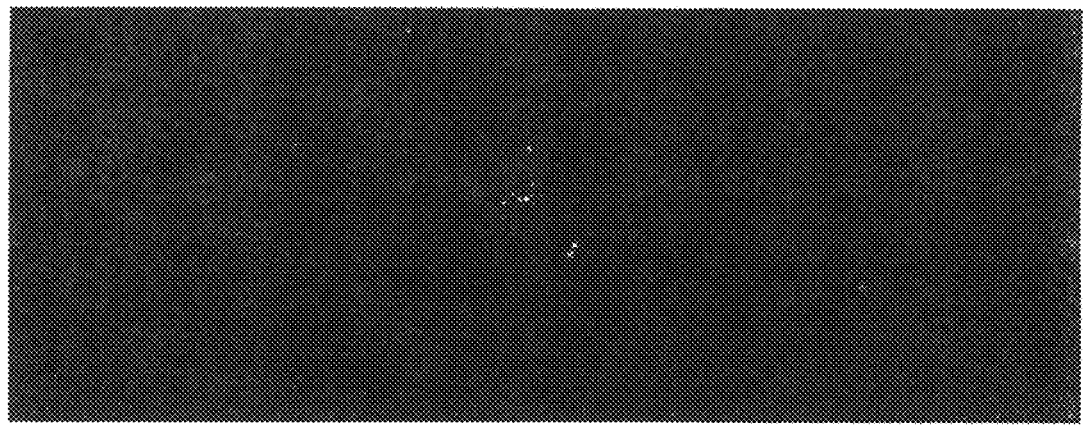
Figure 12:
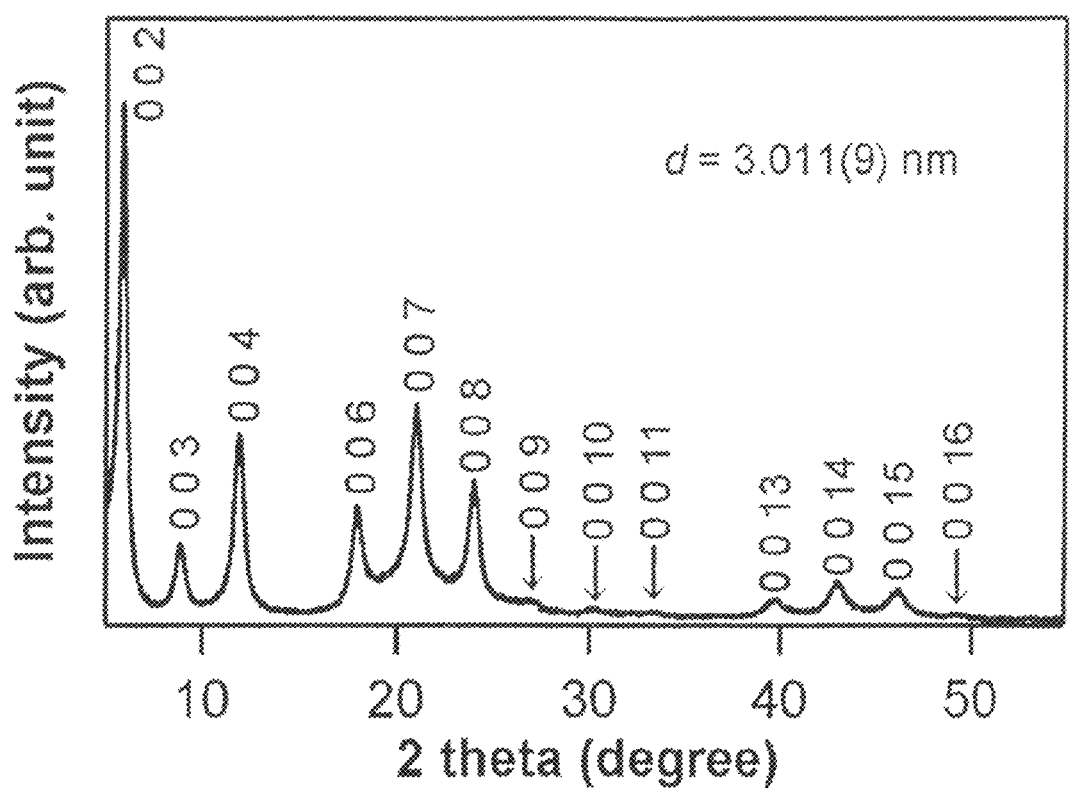
FIG. 12 shows an X-ray diffraction diagram for a glass sheet coated with the luminescent nanosheet of Experiment No. 1 using a paintbrush.

It has been confirmed that the fluorescent feature of the sample before condensed by centrifugal separation into the paint is kept intact (FIG. 10). It has just only been confirmed that the $K_{1.5}Eu_{0.5}Ta_3O_{10}$ nanosheet paint gives out far red emission by ultraviolet irradiation, but it has also been confirmed from its excitation spectra that emission by excitation of the nanosheet host near 322 nm is much higher in luminescent efficiency than that by direct excitation of the Eu$^{3+}$ luminescence center. Upon coated and dried on the substrate, this nanosheet luminescent material is transparent, yet it gives out an emission intensity high enough to be visible by the naked eye under ultraviolet light (FIG. 11). It has been confirmed from the results of X-ray diffraction that in the nanosheet paint coated on the glass substrate, the nanosheet crystals are impeccably oriented such that the glass sheet plane is parallel with the nanosheet plane (FIG. 12). It has therefore been verified that use of the nanosheet paint can result in ready formation of a film with crystals oriented in place.

EXAMPLE 3

Example 4 is now explained with reference to an $Eu_{0.56}Ta_2O_7$ nanosheet solution as an example.

Synthesis

A layered tantalum oxide of the perovskite type: $Li_2Eu_{2/3}Ta_2O_7$ that becomes the first precursor is obtained by mixing together powders of the raw materials $Li_2CO_3$, $Eu_2O_3$ and $Ta_2O_5$ at 2:2/3:3, and applying a solid-phase reaction to the mixture in a platinum crucible at 1,600° C. (an incremental 50° C.) in air.

By allowing the first precursor to react with about 2M nitric acid at room temperature for 3 days, it is changed into the second precursor $H_2Eu_{0.56}Ta_2O_7$ that is an acidic solid in which Li$^+$ in the first precursor is ion exchanged with H$^+$, and some part of Eu was extracted.

Finally, the second precursor and an aqueous solution of a bulky, alkaline molecule: tetrabutylammonium hydroxide (TBAOH) are reacted under agitation at room temperature for 1 week to exfoliate the layered oxide precursor layer by layer, thereby obtaining $Eu_{0.56}Ta_2O_7$ that is a tantalum oxide luminescent nanosheet with the rare earth luminescence center included in the crystal structure. This luminescent nanosheet aqueous solution is condensed by a centrifuge at the rpm and centrifuging time set out in Table 3, given just below, as non-exfoliated matter or a supernatant liquid is removed off, whereby nanosheet solutions are obtained with the concentrations set out in Table 3.

TABLE 3

Figure 13:
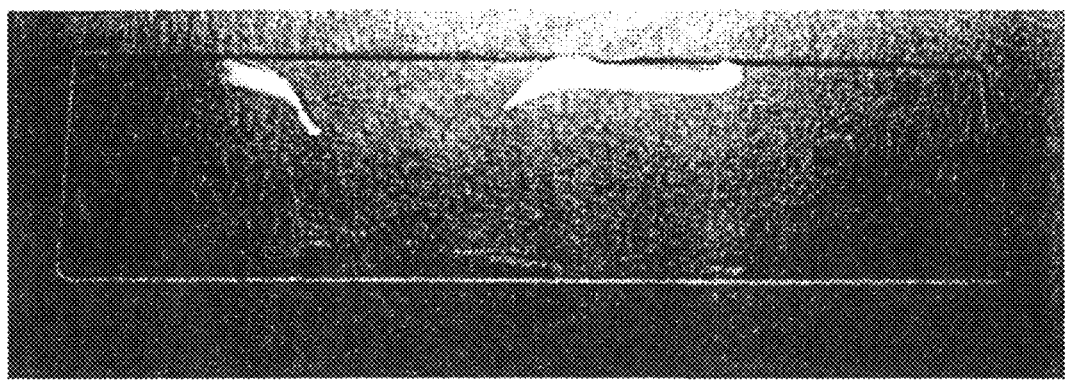
Figure 14:
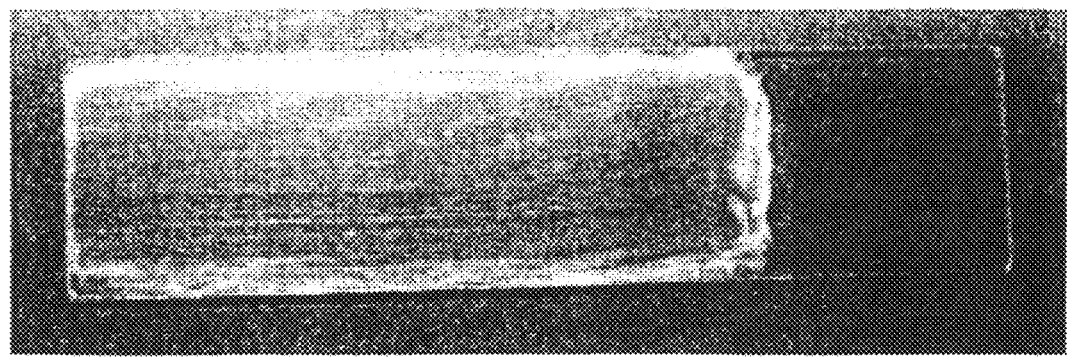
Figure 15:
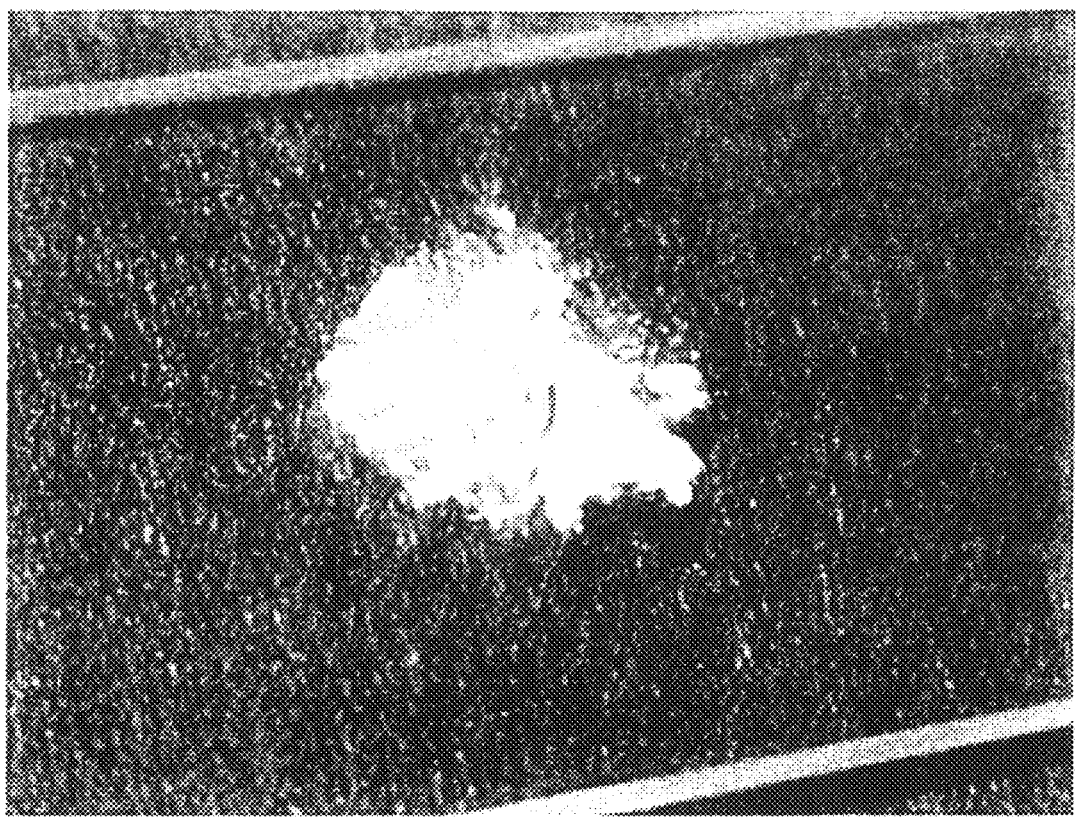
Figure 16:
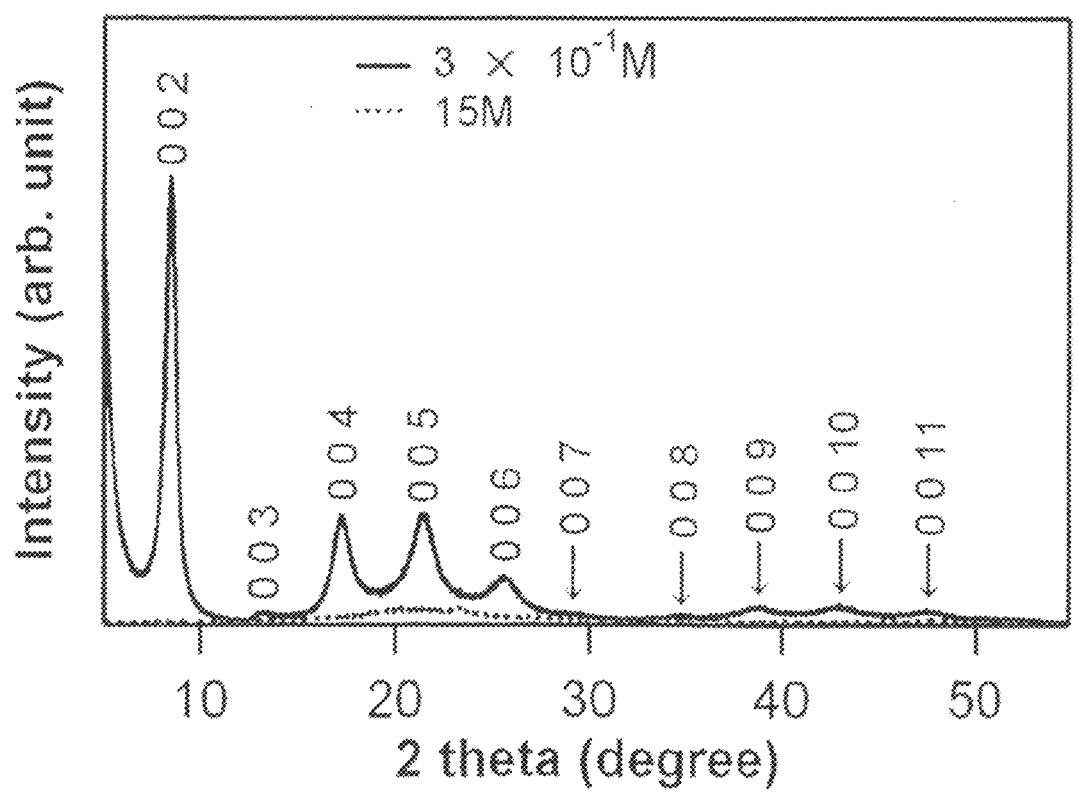
FIG. 16 is a graph indicative of the results of X-ray diffractions in Experiment Nos. 3 and 4.

| | | Experiment No. | | |
|---|---|---|---|---|
| | | 2 | 3 | 4 |
| Centrifuging | ×$10^3$ rpm | 2.5 | 20 | NA |
| | G | 6 × $10^2$ | 36 × $10^2$ | — |
| | Time (min.) | 5 | 30 | NA |
| Contents of the Nanosheet Solution | | 2' | 3' | 4' |
| Concentrations (M) | | 1 × $10^{-3}$ | 3 × $10^{-1}$ | 15 |
| (A) | Results | Repelling | (B) | (C) |
| | | Coating State | | |
| | References | FIG. 13 | FIG. 14 | FIG. 15 |
| | Results | NA | (D) | (E) |
| | | Orientation | | |
| | References | | FIG. 16 | FIG. 16 |

2': Unexfoliated matter-free supernatant liquid of the luminescent nanosheet aqueous solution subjected to centrifugal separation.
3': Supernatant liquid-free condensed nanosheet solution obtained by centrifugal separation of the Experiment No. 2 nanosheet solution.
4': Pasty nanosheet obtained by evaporation of the solvent from the Experiment No. 3 nanosheet solution (poor in orientation capability).
(A) Results of coating onto the quartz glass substrate.
(B) Capable of being coated onto the quartz substrate.
(C) Incapable of being coated due to pastiness.
(D) Orientation parallel with the substrate plane.
(E) Poor in orientation capability.

Estimation

In an attempt of coating a substrate with the nano-sheet solutions synthesized under the above conditions (Experiment Nos. 2 to 4) at a concentration of 1×$10^{-3}$ M, they are repelled (FIG. 13); however, the nanosheet paint condensed up to 3×$10^{-1}$ M can be coated on the substrate without being repelled (FIG. 14). In the coated 3×$10^{-1}$ M nanosheet paint, the nanosheet crystals are impeccably oriented such that the substrate plane is parallel with the nanosheet plane, as can be seen from the results of X-ray diffraction (FIG. 16). However, the paint condensed up to 15 M by evaporation of the solvent (water here) just only turns into a sticky paste having difficulty in uniform coating (FIG. 15), but it is also poor in crystalline and orientation features, as can be seen from the results of X-ray diffraction (FIG. 16).

EXAMPLE 4

Example 4 is here explained with reference to an ethanol dispersion of $(K_{1.5}Eu_{0.5})Ta_3O_{10}$ nanosheet as an example.

Synthesis

A double perovskite tantalum oxide $K(K_{1.5}Eu_{0.5})Ta_3O_{10}$ that becomes the first precursor is obtained by mixing together powders of the raw materials $K_2CO_3$, $Eu_2O_3$ and $Ta_2O_5$ at 5:1:3, and applying a solid-phase reaction to the mixture in a platinum crucible at 1,225° C.

By allowing the first precursor $K(K_{1.5}Eu_{0.5})Ta_3O_{10}$ to react with about 2M nitric acid at room temperature for 3 days, it is changed into the second precursor that is an acidic solid in which the alkaline metal in the first precursor is ion exchanged with H. Finally, the second precursor and an aqueous solution of a bulky, alkaline molecule: tetrabutylammonium hydroxide (TBAOH) are reacted under agitation at room temperature for 1 week to exfoliate the layered oxide precursor layer by layer.

An aqueous dispersion of the obtained double perovskite tantalum oxide luminescent nanosheet: $(K_{1.5}Eu_{0.5})Ta_3O_{10}$ may be centrifuged at 2,000 rpm for 15 minutes, thereby removing non-exfoliated matter by sedimentation. The supernatant $(K_{1.5}Eu_{0.5})Ta_3O_{10}$ nanosheet aqueous dispersion free of non-exfoliated matter may be centrifuged at 20,000 rpm for 30 minutes for removal of the supernatant liquid whereby a pasty condensate of $(K_{1.5}Eu_{0.5})Ta_3O_{10}$ nanosheet is obtained. Thirty (30) mL of ethanol are added to this condensate for re-dispersion, and the $(K_{1.5}Eu_{0.5})Ta_3O_{10}$ ethanol dispersion is then centrifuged at 20,000 rpm for 30 minutes for removal of the supernatant liquid. The cycle involving re-dispersion into ethanol and re-condensation of the nano-sheet is once more repeated for making sure removal of the water component. Finally, five (5) mL of ethanol are added to the condensed $(K_{1.5}Eu_{0.5})Ta_3O_{10}$ nanosheet to obtain a $(K_{1.5}Eu_{0.5})Ta_3O_{10}$ nanosheet ethanol dispersion at a concentration of 6×$10^{-2}$ M (Experiment No. 5). Further, this 6×$10^{-2}$ M $(K_{1.5}Eu_{0.5})Ta_3O_{10}$ nanosheet ethanol dispersion is diluted 200 times with fresh ethanol to obtain a $(K_{1.5}Eu_{0.5})Ta_3O_{10}$ nanosheet ethanol dispersion at a concentration of 3×$10^{-4}$ M (Experiment No. 6).

Estimation

Figure 17:
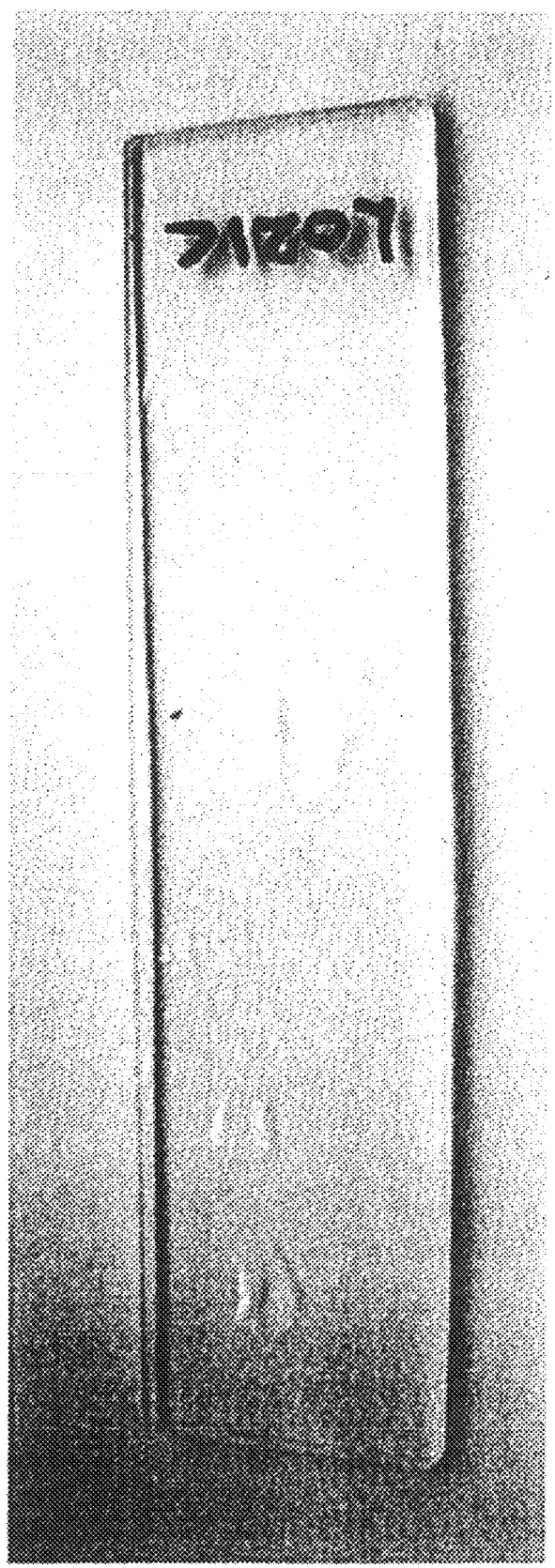
Figure 18:
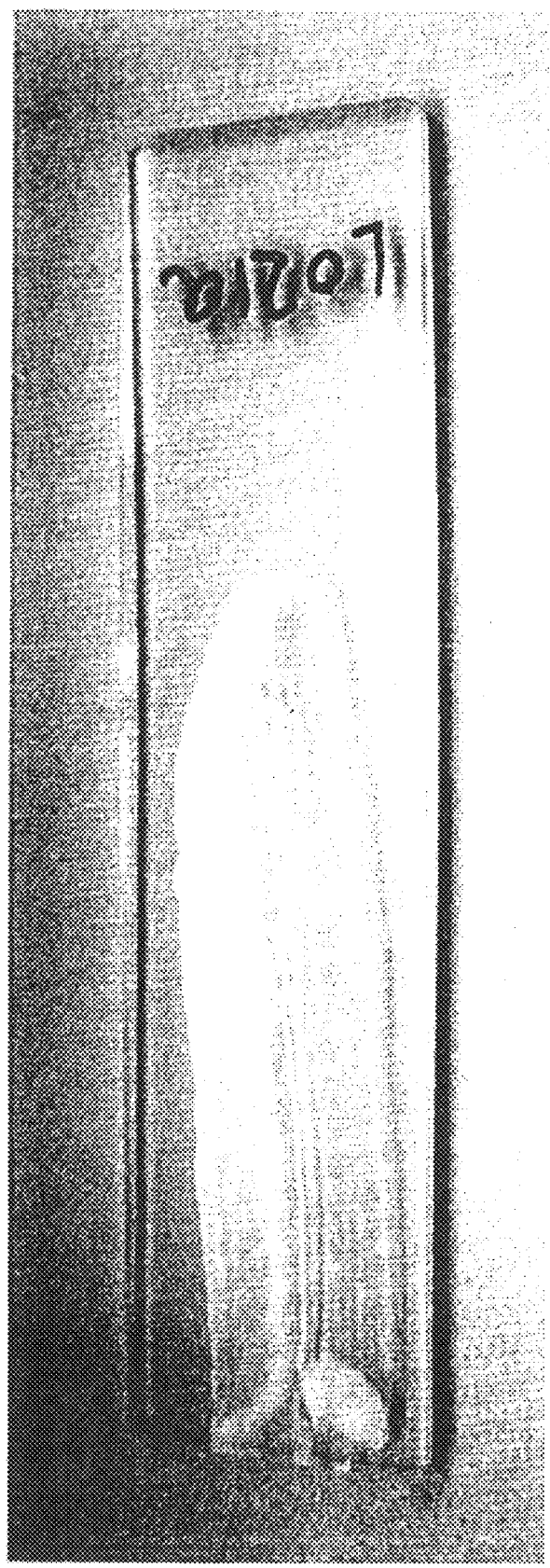
Figure 19:
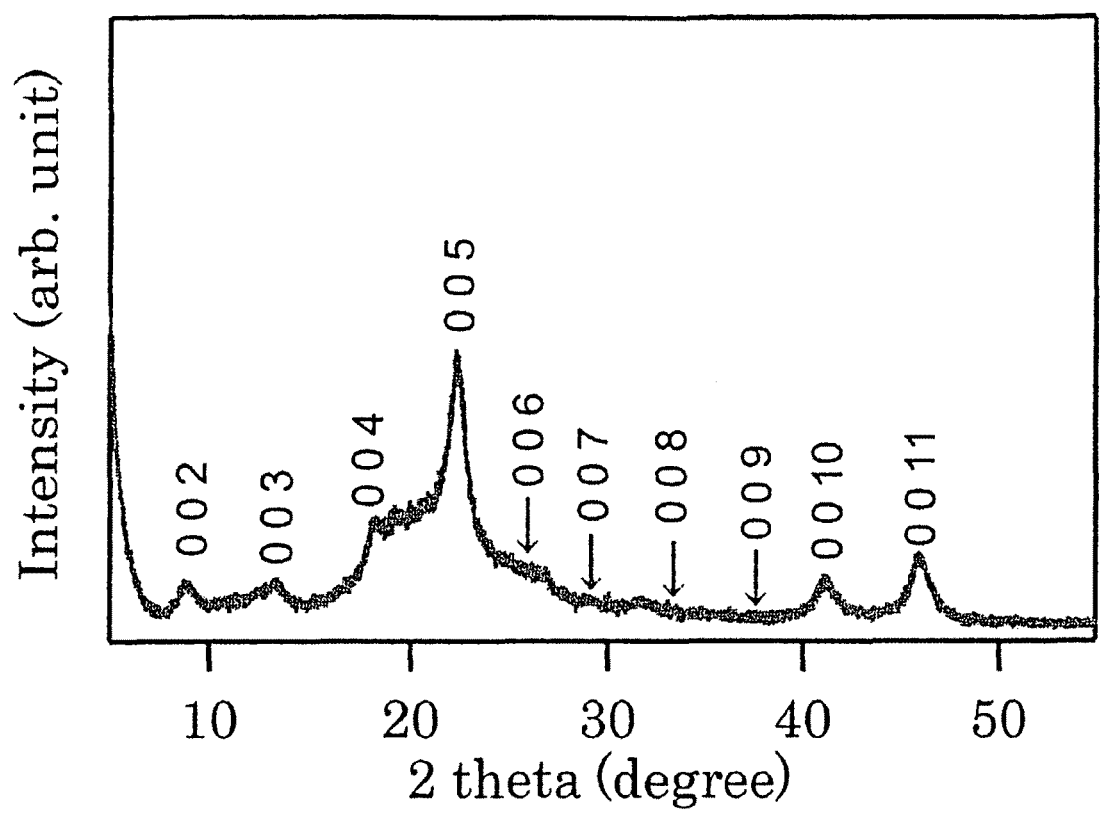
FIG. 19 is a graph indicative of the results of X-ray diffraction of a nanosheet solution in a $6 \times 10^{-2}$ M ethanol solution in Example 4.

In an attempt of coating a glass substrate with a nanosheet solution comprising the 3×$10^{-4}$ M $(K_{1.5}Eu_{0.5})Ta_3O_{10}$ ethanol dispersion prepared under the above conditions, it is repelled (FIG. 17); however, a nanosheet solution comprising 6×$10^{-2}$ M $(K_{1.5}Eu_{0.5})Ta_3O_{10}$ nanosheet ethanol dispersion can be coated on, without being repelled by, a glass substrate (FIG. 18). In the coated 6×$10^{-2}$ M nanosheet paint, it has been confirmed that the nanosheet crystals are impeccably oriented such that the substrate plane is parallel with the sheet plane, as can be seen from the results of X-ray diffraction (FIG. 19). As the solvent ethanol is evaporated off to bring the nanosheet ethanol dispersion up to a concentration of 0.3 M or greater, it gets rid of fluidity, resulting in the inability to coat.

Table 4 shows the results of figuring out the X value in Equation 1 based on Examples 2, 3 and 4.

TABLE 4

| Experiment No. | 1 | 2 | 3 | 4 | 5 | 6 |
|---|---|---|---|---|---|---|
| Nanosheet | | | | | | |
| Concentration (M) | 0.27 | 1 × $10^{-3}$ | 3 × $10^{-1}$ | 15 | 6 × $10^{-2}$ | 3 × $10^{-4}$ |
| Disperse Medium | | | | | | |
| Medium | Water | Water | Water | Water | Ethanol | Ethanol |
| Vapor Pressure (Torr) | 23.76 | 23.76 | 23.76 | 23.76 | 59.00 | 59.00 |
| X Value | 8.9 × $10^4$ | 3.3 × $10^2$ | 9.9 × $10^4$ | 4.9 × $10^6$ | 7.6 × $10^5$ | 3.8 × $10^3$ |
| Results of Coating | ○ | Repelling | ○ | Pasty | ○ | Repelling |

Applicability to the Industry

The inventive luminescent nanosheet, because of being capable of transforming excitation energy to luminescent energy with high efficiency, may find applications to fluorescent illuminators, solar cells, color displays or the like.

If distinct luminescent nanosheet paints according to the invention are mixed at varying ratios as is the case with coloring materials, it is then possible to make luminescent nanosheet paints that give out a wide spread of emission colors. It is also possible for one single substrate to retain not only colors but also magnetic features, catalytic features, etc. in various ways.

What is claimed is:

1. A nanosheet paint, comprising:
  a nanosheet in which perovskite octahedral crystal units are linked in a planar configuration dispersed in a disperse medium,
  wherein an X value in following equation found from a vapor pressure of the disperse medium and a concentration of the nanosheet is in a range of less than $4.9 \times 10^6$ to greater than $3.8 \times 10^3$:

$$X = C \times V^{4.01}$$

where C is the concentration (M) of the nanosheet, and V is a saturation vapor pressure (torr) of a solvent at 25° C. and 1 atm.

2. A nanosheet paint, comprising:
  a nanosheet in which perovskite octahedral crystal units are linked in a planar configuration dispersed in a disperse medium,
  wherein an X value in following equation found from a vapor pressure of the disperse medium and a concentration of the nanosheet is in a range of less than $4.9 \times 10^6$ to greater than $3.8 \times 10^3$:

$$X = C \times V^{4.01}$$

where C is the concentration (M) of the nanosheet, and V is a saturation vapor pressure (torr) of a solvent at 25° C. and 1 atm,
  wherein each of the perovskite octahedral crystal units comprises a tantalum oxide or a niobium oxide, and
  an element providing a luminescence center is solid solubilized between the stacked octahedral crystal units.

* * * * *